United States Patent [19]

Galbraith et al.

[11] Patent Number: 5,095,228

[45] Date of Patent: Mar. 10, 1992

[54] CIRCUITS FOR PREVENTING BREAKDOWN OF LOW-VOLTAGE DEVICE INPUTS DURING HIGH VOLTAGE ANTIFUSE PROGRAMMING

[75] Inventors: Douglas C. Galbraith, Fremont; Jonathan W. Greene, Palo Alto, both of Calif.

[73] Assignee: Actel Corporation, Sunnyvale, Calif.

[21] Appl. No.: 687,980

[22] Filed: Apr. 19, 1991

[51] Int. Cl.⁵ .................... H03K 17/16; H03K 17/10
[52] U.S. Cl. ................... 307/443; 365/226; 361/91; 307/296.5; 307/475
[58] Field of Search ............ 307/443, 451, 296.5, 307/475; 361/118, 119, 91; 365/226, 228, 189.11

[56] References Cited

U.S. PATENT DOCUMENTS

| | | | |
|---|---|---|---|
| 4,565,932 | 1/1986 | Kuo et al. | 307/475 |
| 4,712,023 | 12/1987 | Otsuki et al. | 307/475 |
| 4,742,492 | 5/1988 | Smayling et al. | 307/296.5 |
| 4,908,799 | 3/1990 | Gaudronmeau | 365/228 |
| 4,916,334 | 4/1990 | Minagawa et al. | 307/296.5 |
| 4,956,569 | 9/1990 | Olivo et al. | 365/226 |

Primary Examiner—David Hudspeth
Assistant Examiner—Andrew Sanders
Attorney, Agent, or Firm—Kenneth D'Alessandro

[57] ABSTRACT

A circuit for isolating a first low-voltage circuit mode from a second circuit node which carries high programming voltages during programming of user-programmable interconnect elements includes a novel two input NAND gate having one input structure configured from high voltage devices connected to the second circuit node. The other input of the NAND gate is a control input for the isolation device and is connected to a low-voltage logic signal which is high when the signal from the high programming voltage node is to be passed through to the low-voltage node and low when the low-voltage node is to be isolated from the high programming voltage node. The output of the NAND gate is connected to the first low-voltage circuit node.

4 Claims, 2 Drawing Sheets

CIRCUITS FOR PREVENTING BREAKDOWN OF LOW-VOLTAGE DEVICE INPUTS DURING HIGH VOLTAGE ANTIFUSE PROGRAMMING

BACKGROUND OF THE INVENTION

1. Field Of The Invention

The present invention relates to user-configurable integrated circuits. More particularly, the present invention relates to user-configurable integrated circuits including logic circuits fabricated from low-voltage devices having relatively low breakdown voltages disposed on the same integrated circuit substrate as user-programmable interconnect elements which are programmed by application of a programming voltage in excess of the voltage which can be withstood by the low-voltage devices. In such integrated circuits, both the inputs and outputs of such low-voltage devices are typically connected to circuit nodes common to one or more of the user-programmable interconnect elements. The present invention includes circuits for preventing damage to the inputs of the low-voltage devices by isolating these circuit nodes from the inputs of the low-voltage devices during the application of high voltage while programming the user-programmable interconnect elements.

2. The Prior Art

Presently-known user-configurable integrated circuits which employ user-programmable interconnect elements programmed by application of a relatively high programming voltage to the user-programmable interconnect elements require some form of isolation between the circuit nodes to which the high programming voltage is applied and other circuit nodes connected to the inputs of low-voltage devices, such as low-voltage MOS transistors, which are used in the functional circuitry of the integrated circuits.

Examples of such user-configurable integrated circuits include the ACT-1xxx family of user-configurable gate array integrated circuits manufactured and marketed by Actel Corporation of Sunnyvale, California, assignee of the present application. These integrated circuits employ isolation structures to connect the inputs of the low-voltage devices comprising the logic circuits in the array to the array of antifuses which are programmed by a user to interconnect the low-voltage circuits in a desired manner.

The isolation structure used in these products acts to disconnect the inputs of the low-voltage logic circuits from the antifuse array during programming of the antifuses in order to protect the low-voltage devices against destruction resulting from transistor breakdown mechanisms caused by application of the high programming voltage. While this isolation circuit structure is useful to preventing damage to the inputs of the low-voltage logic circuits during antifuse programming, it presents several problems.

First, the current isolation structure requires a charge pump to generate the voltages necessary for its operation. Charge pumps take up space on the integrated circuit die layout and add standby power to the integrated circuit operating requirements. The provision of charge pump circuits creates circuit layout problems because of the high voltage considerations, and otherwise complicates the design of the integrated circuit.

One such problem created by charge pump circuits is that the pump line is inherently a VTIF line for a parasitic MOS field device. This type of line creates a layout problem because its poly can only comprise a single gate. If two or more gates are connected to such a line, they must be broken by a metal jumper which breaks a parasitic MOS field device. Providing jumpers consumes additional layout area and blocks metal routing paths. Since a pump line typically runs to all inputs of functional circuit modules in a user-configurable circuit array, many jumpers are required.

In addition, the isolation circuit structure inherently produces a power inrush current which must be controlled by providing high power charge pumps and shut-down logic. These circuits add further to the standby power dissipation of the integrated circuit, occupy additional area on the integrated circuit die, and further complicate the design.

Finally, since this isolation device is in the signal path when the integrated circuit is not in a programming cycle, it acts as a delay element in series with the data path, thus slowing down the performance of the integrated circuit.

Given the proliferation of user-configurable integrated circuits which utilize user-programmable interconnect elements which require programming voltages higher than the breakdown voltages of the low-voltage MOS transistors used to configure the operating circuitry on the integrated circuit, there is a need for circuitry which functions during programming to isolate circuit nodes carrying high programming voltages from circuit nodes configured from low-voltage devices.

BRIEF DESCRIPTION OF THE INVENTION

According to the present invention, a circuit for isolating a first low-voltage circuit node comprising an input of a low-voltage device from a second circuit node which carries high programming voltages during programming of user-programmable interconnect elements includes a novel two input NAND gate having one input structure configured from high voltage devices connected to the second circuit node. The other input of the NAND gate is a control input for the isolation device and is connected to a low-voltage logic signal which is high when the signal from the high programming voltage node is to be passed through to the low-voltage node and low when the low-voltage node is to be isolated from the high programming voltage node. The output of the NAND gate is connected to the first low-voltage circuit node.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
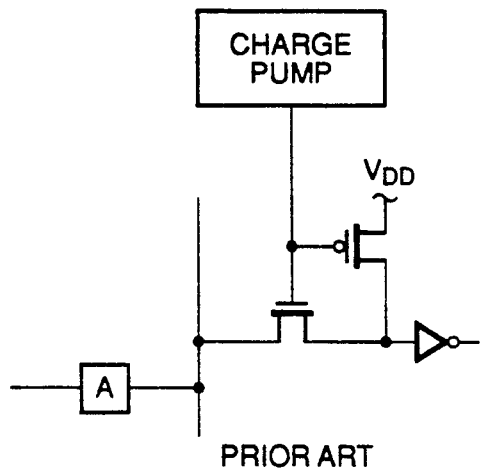
FIG. 1 is a schematic diagram of one typical prior art circuit technique for isolating low-voltage circuitry from circuit nodes carrying programming voltage.

Referring first to FIG. 1, a known prior art isolation circuit is shown for isolating a low-voltage logic element, such as the inverter shown in FIG. 1 from a circuit node (shown as the vertical connector at the left of FIG. 1) upon which high programming voltage is placed to program an antifuse element (shown symbolically as the box labelled "A" in FIG. 1) connected to the circuit node. An N-channel MOS transistor is connected in series between the circuit node which experiences programming voltage and the low voltage logic inverter. A P-channel MOS transistor is connected between a voltage source $V_{DD}$, used to power the low-voltage logic, and the low-voltage logic circuit node at the input to the inverter. The gates of both the N-channel and P-channel MOS transistors are connected to a source of high voltage supplied by a charge pump circuit.

In a typical integrated circuit containing circuits such as are shown in FIG. 1, a charge pump will supply a high voltage gate signal to many such isolation circuits. According to the present invention, isolation protection is provided for low-voltage circuit nodes by circuits which eliminates the layout and other problems presented by such an isolation circuit arrangement.

Figure 2:
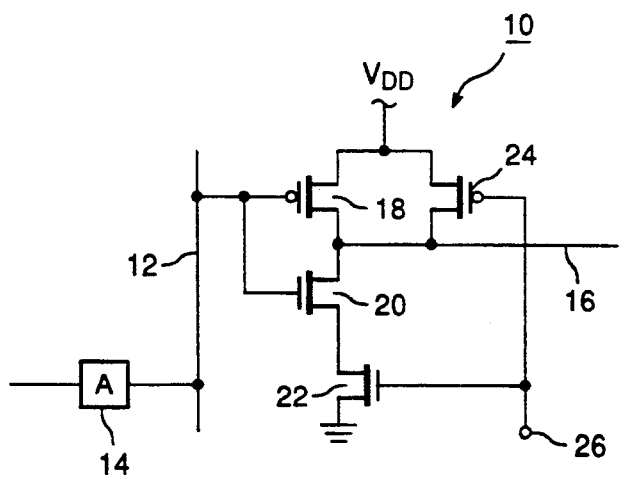
FIG. 2 is a schematic diagram of a first circuit according to the present invention for isolating low-voltage circuitry from circuit nodes carrying programming voltage.

Referring now to FIG. 2, a first isolation circuit 10 according to the present invention provides isolation between a first circuit node 12, which carries a high programming voltage for the purpose of programming antifuse 14, from circuit node 16, which may be connected to low-voltage logic or other circuits employing transistor and/or other devices which are not capable of withstanding the programming voltage of antifuse 14. Isolation circuit 10 includes a first P-channel MOS transistor 18 and a first N-channel MOS transistor 20. First P-channel MOS transistor 18 and first N-channel MOS transistor 20 have their gates commonly connected to circuit node 12. These transistors are presently fabricated with 400Å gates in order to allow them to withstand a high programming voltage on the order of about 18 volts. Obviously, other characteristics, such as LDD structures, nitrided gate dielectrics, etc., can be imparted to these devices as needed to improve its breakdown behavior.

First P-channel MOS transistor 18 and first N-channel MOS transistor 20 are connected in series. Thus, first P-channel MOS transistor 18 has its source connected to a voltage source $V_{DD}$, typically 5 volts, a power supply voltage at which low voltage logic is typically operated. Its drain is connected to the drain of N-channel transistor 20 and to low-voltage circuit node 16, the output of the isolation circuit 10.

The drain of first N-channel transistor 20 is connected to the drain of a second N-channel MOS transistor 22. The source of second N-channel MOS transistor 22 is connected to a voltage source compatible with operation of the low-voltage circuits which may be connected to circuit node 16, usually ground.

A second P-channel MOS transistor 24 is connected between voltage source $V_{DD}$ and low-voltage node 16, the output of isolation circuit 10. The gates of both second P-channel MOS transistor 24 and second N-channel MOS transistor 22 are connected to a control input node 26.

Second N-channel MOS transistor 22 and second P-channel MOS transistor 24 may be fabricated either as high voltage devices or as low voltage devices. The decision is strictly a matter of design choice.

Control input node 26 directs the operation of isolation circuit 10. During programming, control node 26 is held at a low logic level of zero volts. In this state, second N-channel MOS transistor 22 is turned off. Second P-channel MOS transistor 24 is turned on, placing $V_{DD}$ on low-voltage circuit node 16, the output of isolation circuit 10.

During normal low-voltage circuit operation of isolation circuit 10, control node 26 is held high, second P-channel MOS transistor 24 is turned off and second N-channel MOS transistor 22 is turned on. Under these conditions, first P-channel MOS transistor 18 and first N-channel MOS transistor 20 behave as a common inverter.

During programming, the 400Å gate oxide of first P-channel MOS transistor 18 and first N-channel MOS transistor 20 can withstand the 18 volt programming voltage $V_{PP}$ appearing on circuit node 12. At this time, first N-channel MOS transistor 20 is turned on, with its $V_{DS} < 10$ volts (i.e., its $V_{DS} < V_{BII}$), so it will not break down. First P-channel MOS transistor 18 is turned off and could therefore suffer from gate-aided breakdown mechanisms ($V_{BDSS} < V_{GD}$). But the drain of first P-channel MOS transistor 18 is held at $V_{DD}$ by the action of second P-channel MOS transistor 24, thereby reducing the gate to drain voltage of first P-channel MODS transistor 18 to $V_{PP} - V_{DD}$, a safe value, assuming that first P-channel MOS transistor has a $V_{BDSS}$ of 16 volts, $V_{DD}$ is 5 volts, and a $V_{PP}$ of 18 volts.

Those of ordinary skill in the art will realize that the isolation circuit 10 of FIG. 2 functions as a NAND gate with circuit node 12 as a first input and control node 26 as a second input. It also functions as an analog amplifier and is thus not a slew-rate-limited logic element which will not degrade circuit speed. Finally, because of the inverting aspect of the NAND function, the inverter of the isolation circuit of FIG. 1 is no longer necessary. In fact, the first logic stage may be merged into that structure (i.e., NAND, NOR, etc.).

Those of ordinary skill will also realize that the isolation circuit 10 of FIG. 2 does not suffer from the inrush current problem of the charge pump driven isolation circuit of FIG. 1. Since the output voltage of the charge pump of FIG. 1 rises more slowly than does $V_{DD}$, current will flow from $V_{DD}$ to ground (assuming that first circuit node 12 is grounded) for any pump voltage between a $V_t$ of the Nchannel device above ground and a $V_t$ of the P-channel device below $V_{DD}$. Since the inputs of the isolation circuit 10 of FIG. 2 power up at about the same speed as $V_{DD}$, there is no inrush current.

Figure 3:
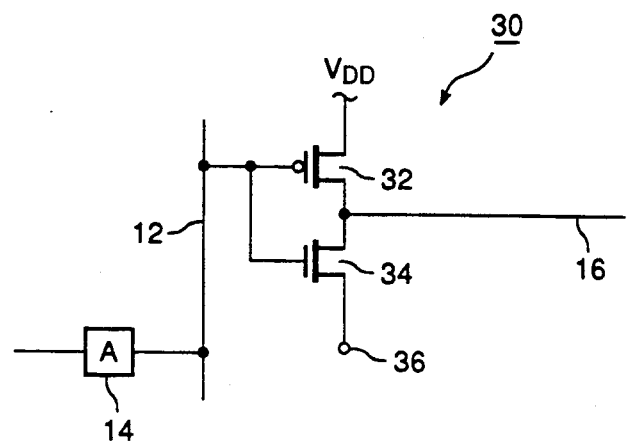
FIG. 3 is a schematic diagram of a second circuit according to the present invention for isolating low-voltage circuitry from circuit nodes carrying programming voltage.

A second isolation circuit 30 according to the present invention shown in FIG. 3 provides protection and isolation between a circuit node 12 where high voltage may be used to program an antifuse 14, and a low-voltage circuit node 16. Isolation circuit 30 includes a P-channel MOS transistor 32 and a N-channel MOS transistor 34. P-channel MOS transistor 32 and N-channel MOS transistor 34 have their gates commonly connected to circuit node 12. These transistors are fabricated with 400Å gates in order to allow them to withstand a high programming voltage on the order of about 18 volts.

P-channel MOS transistor 32 and N-channel MOS transistor 34 are connected in series between a voltage source $V_{DD}$, typically 5 volts, a power supply voltage at which low voltage logic is typically operated, and a control node 36. Thus, P-channel MOS transistor 32 has its source connected to voltage source $V_{DD}$, and its drain connected to the drain of N-channel transistor 34, the output node 16 of isolation circuit 30. The source of N-channel MOS transistor 34 is connected to control node 36.

Control input node 36 directs the operation of isolation circuit 30. During programming, control node 36 is held at a high logic level. In this state, N-channel MOS transistor 34 is turned on since its gate is at $V_{PP}$, about 18 volts thus placing the $V_{DD}$ level at control node 36 on output node 16. Since output node 16 is at $V_{DD}$, the gate aided breakdown mechanism cannot affect P-channel MOS transistor 32.

During normal low-voltage circuit operation of isolation circuit 30, the source of N-channel MOS transistor 34 is at ground. Under these conditions, P-channel MOS transistor 32 and N-channel MOS transistor 34 behave as a common inverter.

Those of ordinary skill in the art will realize that, if an inverter is placed in series with control node 36, the isolation circuit 30 of FIG. 3 functions as a NAND gate with circuit node 12 as a first input and control node 36 as a second input. It also functions as an analog amplifier and is thus not a slew-rate-limited logic element which will not degrade circuit speed. Finally, because of the inverting aspect of the NAND function, the inverter of the isolation circuit of FIG. 1 is no longer necessary.

Figure 4:
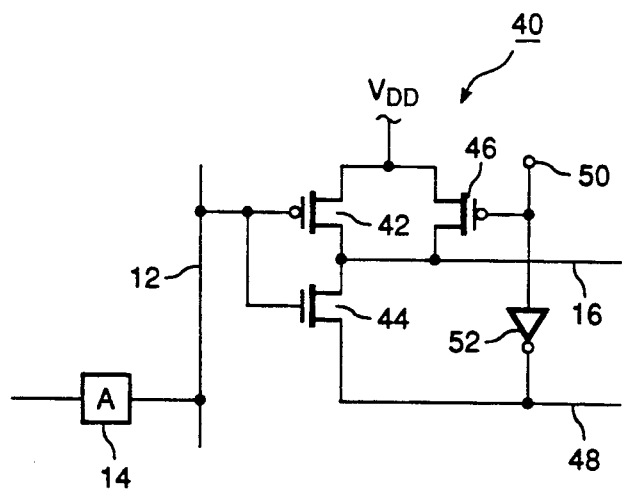
FIG. 4 is a schematic diagram of a third circuit according to the present invention for isolating low-voltage circuitry from circuit nodes carrying programming voltage.

Referring now to FIG. 4 a third isolation circuit 40 according to the present invention provides protection and provides protection and isolation between a circuit node 12 where high voltage may be used to program an antifuse 14, and a low-voltage circuit node 16. Isolation circuit 40 includes a P-channel MOS transistor 42 and a N-channel MOS transistor 44. P-channel MOS transistor 42 and N-channel MOS transistor 44 have their gates commonly connected to circuit node 12. These transistors are fabricated with 400Å gates in order to allow them to withstand a high programming voltage on the order of about 18 volts.

P-channel MOS transistor 42 and N-channel MOS transistor 44 are connected in series between a voltage source $V_{DD}$, typically 5 volts, a power supply voltage at which low voltage logic is typically operated, and a control node 46. Thus, P-channel MOS transistor 42 has its source connected to voltage source $V_{DD}$, and its drain connected to the drain of N-channel transistor 44, the output node of isolation circuit 40 at low-voltage circuit node 16. The source of N-channel MOS transistor 44 is connected to a control node 48.

Control input node 50 directs the operation of isolation circuit 40 and is connected to control node 48 through inverter 52. During programming, control node 50 is held at a low logic level and control node 48 is held at a high logic level through inverter 52. In this state, P-channel MOS transistor 46 is turned on and output low-voltage circuit node 16 is held at $V_{DD}$. N-channel MOS transistor 44 is protected from $V_{BII}$, since its source and drain are both at $V_{DD}$. Since output node 16 is at $V_{DD}$, the gate aided breakdown mechanism cannot affect P-channel MOS transistor 42.

During normal low-voltage circuit operation of isolation circuit 40, second P-channel MOS transistor 46 is turned off and the source of N-channel MOS transistor 44 is grounded. Under these conditions, first P-channel MOS transistor 42 and N-channel MOS transistor 44 behave as a common inverter.

Those of ordinary skill in the art will realize that the isolation circuit 40 of FIG. 4 functions as a NAND gate with circuit node 12 as a first input and control node 50 as a second input. It also functions as an analog amplifier and is thus not a slew-rate-limited logic element which will not degrade circuit speed. Finally, because of the inverting aspect of the NAND function, the inverter of the isolation circuit of FIG. 1 is no longer necessary.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. In a user-configurable integrated circuit employing low-voltage circuit elements which may be interconnected by user-programmable interconnection elements which may be programmed by a programming voltage having a magnitude larger than the voltage which can be withstood by said low-voltage circuit elements, an isolation circuit for protecting low-voltage circuit nodes to which said low-voltage circuit elements are connected from destruction by application of said programming voltage during programming of said integrated circuit, comprising a NAND gate, said NAND gate having a first input connected to a circuit node upon which said programming voltage may appear, said first input configured to withstand said programming voltage, a second input connected to a control logic signal at voltage levels compatible with operation of said low-voltage circuits, and an output connected to at least one of said low-voltage circuit elements.

2. In a user-configurable integrated circuit employing low-voltage circuit elements which may be interconnected by user-programmable interconnection elements which may be programmed by a programming voltage having a magnitude larger than the voltage which can be withstood by said low-voltage circuit elements, an isolation circuit for protecting a first, low-voltage, circuit node to which said low-voltage circuit elements is connected from destruction by application of said programming voltage to a second, high voltage, circuit node which may carry high voltage during programming of said integrated circuit, comprising:
   a control node;
   a P-channel MOS transistor having a gate connected to second circuit node, a source connected to a first voltage source for said low-voltage circuit elements, and a drain connected to said first circuit node, said P-channel MOS transistor fabricated to withstand said programming voltage;
   an N-channel MOS transistor having a gate connected to second circuit node, and a drain connected to said first circuit node, and a source connected to said control node, said N-channel MOS transistor fabricated to withstand said programming voltage.

3. In a user-configurable integrated circuit employing low-voltage circuit elements which may be interconnected by user-programmable interconnection elements which may be programmed by a programming voltage having a magnitude larger than the voltage which can be withstood by said low-voltage circuit elements, an isolation circuit for protecting a first, low-voltage, circuit node to which said low-voltage circuit elements is connected from destruction by application of said programming voltage to a second, high voltage, circuit node which may carry high voltage during programming of said integrated circuit, comprising:

a control node;

a first P-channel MOS transistor having a gate connected to second circuit node, a source connected to a first voltage source for said low-voltage circuit elements, and a drain connected to said first circuit node, said first P-channel MOS transistor fabricated to withstand said programming voltage;

a first N-channel MOS transistor having a gate connected to second circuit node, and a drain connected to said first circuit node, and a source, said first N-channel MOS transistor fabricated to withstand said programming voltage;

a second N-channel MOS transistor having a drain connected to said source of said first N-channel MOS transistor, a source connected to a second voltage source for said low-voltage circuit elements, said second voltage source at a lower potential than said first voltage source, and a gate connected to said control node;

a second P-channel MOS transistor having a source connected to said first voltage source, a drain connected to said first circuit node, and a gate connected to said control node.

4. In a user-configurable integrated circuit employing low-voltage circuit elements which may be interconnected by user-programmable interconnection elements which may be programmed by a programming voltage having a magnitude larger than the voltage which can be withstood by said low-voltage circuit elements, an isolation circuit for protecting a first, low-voltage, circuit node to which said low-voltage circuit elements is connected from destruction by application of said programming voltage to a second, high voltage, circuit node which may carry high voltage during programming of said integrated circuit, comprising:

a control node;

a first P-channel MOS transistor having a gate connected to second circuit node, a source connected to a first voltage source for said low-voltage circuit elements, and a drain connected to said first circuit node, said first P-channel MOS transistor fabricated to withstand said programming voltage;

an N-channel MOS transistor having a gate connected to second circuit node, and a drain connected to said first circuit node, and a source, said N-channel MOS transistor fabricated to withstand said programming voltage;

a second P-channel MOS transistor having a source connected to said first voltage source, a drain connected to said first circuit node, and a gate connected to said control node;

in inverter having an input connected to said control node and an output connected to said source of said N-channel MOS transistor.

* * * * *